US012568731B2

(12) United States Patent
Zhou et al.

(10) Patent No.: US 12,568,731 B2
(45) Date of Patent: Mar. 3, 2026

(54) QUANTUM DOT FILM, METHOD FOR PREPARING THE SAME, AND QUANTUM DOT LIGHT EMITTING DIODE

(71) Applicant: TCL TECHNOLOGY GROUP CORPORATION, Guangdong (CN)

(72) Inventors: Likuan Zhou, Guangdong (CN); Wenxin Zou, Guangdong (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 589 days.

(21) Appl. No.: 17/936,053

(22) Filed: Sep. 28, 2022

(65) Prior Publication Data

US 2023/0023840 A1      Jan. 26, 2023

Related U.S. Application Data

(63) Continuation of application No. PCT/CN2020/141767, filed on Dec. 30, 2020.

(30) Foreign Application Priority Data

Jul. 22, 2020    (CN) .......................... 202010709907.0

(51) Int. Cl.
*H10K 50/115* (2023.01)
*B82Y 30/00* (2011.01)
(Continued)

(52) U.S. Cl.
CPC .......... *H10K 50/115* (2023.02); *H10K 71/12* (2023.02); *H10K 85/00* (2023.02); *H10K 85/114* (2023.02);
(Continued)

(58) Field of Classification Search
CPC ...... H10K 50/115; H10K 85/00; H10K 71/12; H10K 85/114; H10K 71/40; B82Y 30/00; B82Y 40/00
(Continued)

(56) References Cited

U.S. PATENT DOCUMENTS

2010/0289001 A1    11/2010   Kahen et al.
2013/0307010 A1*   11/2013   Hikmet .................. G02B 5/206
                                                          257/98

(Continued)

FOREIGN PATENT DOCUMENTS

CN          106098884 A      11/2016
CN          107833976 A      3/2018
(Continued)

*Primary Examiner* — Eric W Jones
*Assistant Examiner* — Colin Russell McCutcheon

(57) ABSTRACT

A quantum dot film, a method for preparing the same, and a quantum dot light emitting diode are provided. The method for preparing the quantum dot film includes: providing a substrate; and depositing a mixed solution containing a quantum dot and a high molecular polymer onto the substrate, and performing annealing treatment to obtain the quantum dot film. A temperature of the annealing treatment is greater than or equal to a glass transition temperature of the high molecular polymer. The preparation method can make the position of the quantum dot in the quantum dot film rearranged, such that the quantum dot is tightly accumulated and regularly arranged in the high molecular polymer, whereby forming a flat quantum dot film. The quantum dot film obtained from the preparation method, when applied to the quantum dot light emitting device, can significantly improve the electro-optical efficiency and lifespan of the device.

18 Claims, 5 Drawing Sheets providing a substrate; and        ⟶ S01 depositing a mixed solution containing a quantum dot and a high molecular polymer onto the substrate, performing annealing treatment to obtain the quantum dot film; in which, a temperature of the annealing treatment is greater than or equal to a glass transition temperature of the high molecular polymer.        ⟶ S02

(51) Int. Cl.
    *B82Y 40/00*        (2011.01)
    *H10K 71/12*        (2023.01)
    *H10K 71/40*        (2023.01)
    *H10K 85/00*        (2023.01)
    *H10K 85/10*        (2023.01)

(52) U.S. Cl.
    CPC ............... *B82Y 30/00* (2013.01); *B82Y 40/00*
    (2013.01); *H10K 71/40* (2023.02)

(58) Field of Classification Search
    USPC ........................................................ 257/40
    See application file for complete search history.

(56) References Cited

U.S. PATENT DOCUMENTS

| | | |
|---|---|---|
| 2019/0276734 A1 | 9/2019 | Kim et al. |
| 2020/0058884 A1 | 2/2020 | Park et al. |

FOREIGN PATENT DOCUMENTS

| | | | |
|---|---|---|---|
| CN | 109888114 A | 6/2019 | |
| CN | 109962128 A * | 7/2019 | ............. H10H 20/01 |

* cited by examiner

QUANTUM DOT FILM, METHOD FOR PREPARING THE SAME, AND QUANTUM DOT LIGHT EMITTING DIODE

CROSS-REFERENCE TO RELATED APPLICATIONS

This application is a continuation of International Patent Application No. PCT/CN2020/141767 with an international filing date of Dec. 30, 2020, designating the U.S., now pending, and further claims priority benefits to Chinese Patent Application No. 202010709907.0 filed Jul. 22, 2020. The contents of all of the aforementioned applications, including any intervening amendments thereto, are incorporated herein by reference.

BACKGROUND

1. Technical Field

The present application relates to the field of display technology, and more particularly to a quantum dot film, a method for preparing the same, and a quantum dot light emitting diode.

2. Related Art

In recent years, due to many advantages presented in the field of lighting and display, a solid-state light-emitting diode (LED) has been paid more and more attention by researchers and the industry. In addition, a quantum dot light emitting diode (QLED) is advantageous in high luminous efficiency, narrow luminescence spectrum, high chemical and optical stability, and can become a high-performance and low-cost electroluminescent device, thus becoming a next generation of light emitting display devices. With the research progress of quantum dot light emitting diode, each of red, green, and blue devices has external quantum efficiency of about 20%, and has good repeatability; however, the working lifespan of the device is not very ideal.

Since the quantum dot light emitting layer of the device adopts a spherical quantum dot (QD) nanomaterial, with a size of generally between 5 and 15 nanometers, the quantum dot light emitting layer obtained by the existing processes including spin coating or printing has the problem of loose accumulation and irregular arrangement of quantum dot material, which easily results in uneven quantum dot film with "holes" and the movement of carriers in the recombination area of the device, thereby adversely affecting the optoelectronic performance and lifespan of the device, and in turn affecting the efficiency and lifespan of the device.

Thus, the related technology needs to be improved.

SUMMARY

It is one of the objectives of embodiments of the present application to provide a quantum dot film and a method for preparing the same, which aims at solving the technical problem of unevenness of the existing quantum dot film.

It is another one of the objectives of embodiments of the present application to provide a quantum dot light emitting diode, which aims at solving the technical problem of unevenness of the existing quantum dot light emitting diode.

In order to tackle the above technical problems, embodiments of the present application adopt the following technical solutions:

In a first aspect, the present application provides a method for preparing a quantum dot film. The method comprises the following steps:

providing a substrate; and depositing a mixed solution containing a quantum dot and a high molecular polymer onto the substrate, and performing annealing treatment to obtain the quantum dot film.

A temperature of the annealing treatment is greater than or equal to a glass transition temperature of the high molecular polymer.

In a second aspect, the present application provides a quantum dot film. The quantum dot light emitting film comprises: a quantum dot and a high molecular polymer. An annealing temperature of the quantum dot film during annealing for film formation is greater than or equal to a glass transition temperature of the high molecular polymer.

In a third aspect, a quantum dot light emitting diode is provided. The quantum dot light emitting diode comprises: an anode, a cathode, and a quantum dot light emitting layer disposed between the anode and the cathode. The quantum dot light emitting layer comprises the quantum dot film provided by the present application.

The method for preparing a quantum dot film provided by embodiments of the present application has the following beneficial effects: in the method for preparing the quantum dot film, the mixed solution containing a quantum dot and a high molecular polymer is deposited on the substrate for annealing treatment so as to obtain the quantum dot film. During the annealing treatment, the temperature of the annealing treatment is greater than or equal to the glass transition temperature of the high molecular polymer, specifically, when the temperature of the annealing treatment is equal to the glass transition temperature of the high molecular polymer, the high molecular polymer is in a high elastic state; and when the temperature of the annealing treatment is greater than the glass transition temperature of the high molecular polymer, the high molecular polymer is in a viscous fluid state. Both the above conditions can make the molecular structure of the high molecular polymer more relaxed, and enable the position of the quantum dot in the quantum dot film to be rearranged, such that the quantum dot is tightly accumulated and regularly arranged in the high molecular polymer, whereby forming a flat quantum dot film. The quantum dot film prepared by such a method, when applied to the quantum dot light emitting device, can significantly improve the electro-optical efficiency and lifespan of the device.

The quantum dot film provided by embodiments of the present application has the following beneficial effects: the quantum dot film comprises the quantum dot and the high molecular polymer. Due that the annealing temperature of the quantum dot film during the annealing treatment is greater than or equal to the glass transition temperature of the high molecular polymer, when the quantum dot film is formed in such condition, the position of the quantum dot is rearranged and is tightly accumulated and regularly arranged in the high molecular polymer, whereby forming a flat quantum dot film. The quantum dot film, when applied to the quantum dot light emitting device, can significantly improve the electro-optical efficiency and lifespan of the device.

The quantum dot light emitting diode provided by embodiments of the present application has the following beneficial effects: the quantum dot light emitting layer in the quantum dot light emitting diode is the specific quantum dot film provided by the present application, therefore, the quantum dot film can significantly improve the electro-optical efficiency and lifespan of the quantum dot light emitting diode.

BRIEF DESCRIPTION OF THE DRAWINGS

In order to illustrate the technical solutions in embodiments of the present application more clearly, accompanying drawings that are used in the description of the embodiments or exemplary technologies are briefly introduced hereinbelow. Obviously, the drawings in the following description are only some embodiments of the present application. For those skilled in the art, other drawings can also be obtained according to these drawings without any creative effort.

DETAILED DESCRIPTION OF THE EMBODIMENTS

In order to make the purpose, technical solutions, and advantages of the present application more clearly understood, the present application will be described in further detail hereinbelow with reference to the accompanying drawings and embodiments. It should be understood that the specific embodiments described herein are only used to explain the present application, but not to limit the present application.

Figure 1:
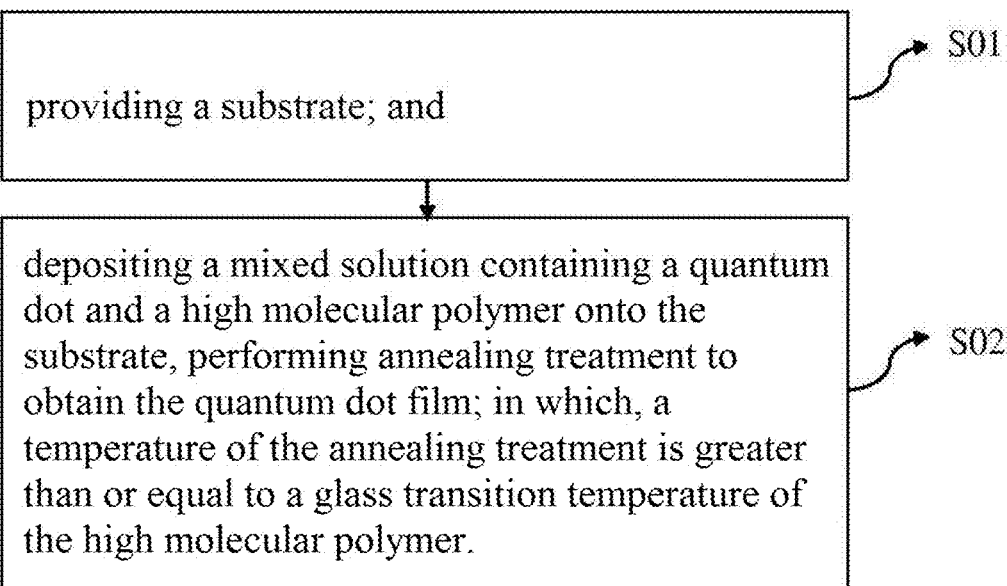
FIG. 1 is a flow chart of a method for preparing a quantum dot film according to an embodiment of the present application.

In an aspect, the present application provides a method for preparing a quantum dot film, as shown in FIG. 1. The method for preparing the quantum dot film comprises the following steps:

S01: providing a substrate; and

S02: depositing a mixed solution containing a quantum dot and a high molecular polymer onto the substrate, and performing annealing treatment to obtain the quantum dot film.

A temperature of the annealing treatment is greater than or equal to a glass transition temperature of the high molecular polymer.

In the method for preparing the quantum dot film provided by the embodiment of the present application, the mixed solution containing a quantum dot and a high molecular polymer is deposited on the substrate for annealing treatment so as to obtain the quantum dot film. During the annealing treatment, the temperature of the annealing treatment is greater than or equal to the glass transition temperature of the high molecular polymer, specifically, when the temperature of the annealing treatment is equal to the glass transition temperature of the high molecular polymer, the high molecular polymer is in a high elastic state; and when the temperature of the annealing treatment is greater than the glass transition temperature of the high molecular polymer, the high molecular polymer is in a viscous fluid state. Both the above conditions can make the molecular structure of the high molecular polymer more relaxed, and enable the position of the quantum dot in the quantum dot film to be rearranged, such that the quantum dot is tightly accumulated and regularly arranged in the high molecular polymer, whereby forming a flat quantum dot film. The quantum dot film prepared by such a method, when applied to the quantum dot light emitting device, can significantly improve the electro-optical efficiency and lifespan of the device.

In some embodiments, the quantum dot comprises: at least one of a single structure quantum dot and a composite structure quantum dot of group II-VI, IV-VI, III-V, and I-VI compounds. Specifically, the composite structure quantum dot comprises a core-shell structure quantum dot. The core constituting the core-shell structure quantum dot comprises: at least one of CdSe, CdS, CdTe, CdSeTe, CdZnS, PbSe, ZnTe, CdSeS, PbS, PbTe, HgS, HgSe, HgTe, GaN, GaP, GaAs, InP, InAs, InZnP, InGaP, and InGaN. The shell constituting the core-shell structure quantum dot comprises at least one of ZnSe, ZnS, and ZnSeS.

In some embodiments, the high molecular polymer is at least one selected from the group consisting of a vinyl-based polymer, an acryl-based polymer, an amide-based polymer, a phenyl-based polymer, a carbonate-based polymer, and any combination thereof. For example, the high molecular polymer can be the vinyl-based polymer, or the acryl-based polymer, or the amide-based polymer, or the phenyl-based polymer, or the carbonate-based polymer, or a combination of any one or two of the above high molecular polymers. Proper high molecular polymer having a glass transition temperature smaller than or equal to the temperature of the annealing treatment is selected from the above high molecular polymers, and mixed with the quantum dot material to prepare the quantum dot film.

Specifically, the vinyl-based polymer is at least one selected from the group consisting of a polyvinyl alcohol, a polyvinyl carbazole, a polyvinyl acetate, a polytetrafluoroethylene, a polyvinylidene fluoride, a polyvinyl chloride, and any combination thereof. The acryl-based polymer is at least one selected from the group consisting of a polyacrylic acid, a polymethyl methacrylate, a poly($\alpha$-butyl cyanoacrylate), a polyacrylamide, a polyacrylonitrile, and any combination thereof. The amide-based polymer is at least one selected from the group consisting of a polydecylidene formamide, a polyethylene glycol sebacamide, and any combination thereof. The phenyl-based polymer is at least one selected from the group consisting of a polyphenylene sulfide, a polyethylene terephthalate, and any combination thereof. The carbonate-based polymer is at least one selected from the group consisting of a polycarbonate diol, a brominated polycarbonate, and any combination thereof.

In some embodiments, the glass transition temperature of the high molecular polymer is between 30 and 200° C. The temperature of the annealing treatment is between 50 and 250° C. The temperature of the annealing treatment is greater than or equal to the glass transition temperature of the high molecular polymer. Specifically, a difference value between the temperature of the annealing treatment and the glass transition temperature of the high molecular polymer is between 30 and 220° C., and 220° C. at most, and the specific difference value may also be between 50 and 130° C.

More preferably, the glass transition temperature range is selected to be between 50 and 150° C., and the temperature of the annealing treatment is between 120 and 180° C. The low glass transition temperature is therefore adapted to perform the low-temperature annealing, having little effect on the thermal aging of the device. For example, a polymethyl methacrylate has a glass transition temperature of 105° C., and the annealing temperature thereof can be selected to be greater than or equal to 105° C. A polytetrafluoroethylene has a glass transition temperature of 130° C., so the annealing temperature thereof can be selected to be greater than or equal to 130° C. A polyacrylamide has a glass transition temperature of 165° C., so the annealing temperature thereof can be selected to be greater than or equal to 165° C.

In some embodiment, the mixed solution containing the quantum dot and the high molecular polymer is prepared by dissolving the quantum dot and the high molecular polymer in a solvent. A concentration of the quantum dot in the mixed solution is between 10 and 50 mg/mL. Specifically, the concentration of the quantum dot material may be 10 mg/mL, 20 mg/mL, 30 mg/mL, 40 mg/mL, 50 mg/mL, and the like; and in such concentration, the quantum dot can have a better dispersion effect. A weight ratio of the high molecular polymer to the quantum dot in the mixed solution is (0.5-10):100. Specifically, the weight ratio of the high molecular polymer to the quantum dot material may be 0.5:100, 1:100, 2:100, 4:100, 5:100, 8:100, and 10:100. In condition of such weight ratio, the quantum dot is enabled to be better accumulated and arranged into a regular quantum dot film. Furthermore, the solvent in the mixed solution is selected from a non-polar solvent. A non-polar solvent having a boiling point of between 50 and 200° C. can be volatilized after the annealing treatment. Specifically, the non-polar solvent is at least one selected from the group consisting of chloroform, toluene, n-hexane, cyclohexane, n-heptane, n-octane, cycloheptane, dioxane, and any combination thereof.

The mixed solution in which the quantum dots and the high molecular polymer are dispersed is deposited on the substrate, then annealing treatment is performed to remove the solvent, so as to obtain the quantum dot film. The annealing process does not affect the stability of the quantum dot.

In some embodiments, the manner of depositing the mixed solution containing the quantum dot and the high molecular polymer on the substrate includes: spin coating, blade coating, printing, and spray coating. The subsequent annealing process can be performed in an anhydrous and oxygen-free environment.

In another aspect, the present application further provides a quantum dot film. The quantum dot light emitting diode comprises a quantum dot and a high molecular polymer. An annealing temperature of the quantum dot film during annealing for film formation is greater than or equal to a glass transition temperature of the high molecular polymer.

The quantum dot film provided by embodiments of the present application comprises the quantum dot and the high molecular polymer. Due that the annealing temperature of the quantum dot film during the annealing treatment is greater than or equal to the glass transition temperature of the high molecular polymer, when the quantum dot film is formed in such condition, the position of the quantum dot is rearranged and is tightly accumulated and regularly arranged in the high molecular polymer, whereby forming a flat quantum dot film. The quantum dot film, when applied to the quantum dot light emitting device, can significantly improve the electro-optical efficiency and lifespan of the device Furthermore, the quantum dot film is obtained from the method for preparing the quantum dot film according to the embodiments of the present application. The quantum dot film provided by embodiments of the present application is obtained from the specific preparation method of the present application. In such quantum dot film, the position of the quantum dot is rearranged, and in turn tightly accumulated and regularly arranged in the high molecular polymer, whereby forming a flat quantum dot film. The quantum dot film prepared by such a method, when applied to the quantum dot light emitting device, can significantly improve the electro-optical efficiency and lifespan of the device.

In an embodiment, a weight ratio of the high molecular polymer to the quantum dot is (0.5-10):100. Specifically, the weight ratio of the high molecular polymer to the quantum dot can be 0.5:100, 1:100, 2:100, 4:100, 5:100, 8:100, 10:100, and the like. The high molecular polymer is at least one selected from the group consisting of a vinyl-based polymer, an acryl-based polymer, an amide-based polymer, a phenyl-based polymer, a carbonate-based polymer, and any combination thereof. Furthermore, the vinyl-based polymer is at least one selected from the group consisting of a polyvinyl alcohol, a polyvinyl carbazole, a polyvinyl acetate, a polytetrafluoroethylene, a polyvinylidene fluoride, a polyvinyl chloride, and any combination thereof. The acryl-based polymer is at least one selected from the group consisting of a polyacrylic acid, a polymethyl methacrylate, a poly($\alpha$-butyl cyanoacrylate), a polyacrylamide, a polyacrylonitrile, and any combination thereof. The amide-based polymer is at least one selected from the group consisting of a polydecylidene formamide, a polyethylene glycol sebacamide, and any combination thereof. The phenyl-based polymer is at least one selected from the group consisting of a polyphenylene sulfide, a polyethylene terephthalate, and any combination thereof. The carbonate-based polymer is at least one selected from the group consisting of a polycarbonate diol, a brominated polycarbonate, and any combination thereof.

Preferably, the glass transition temperature of the high molecular polymer is smaller than 150° C., and an annealing temperature can be selected to be smaller than 180° C., to avoid the thermal aging effect on the functional layers of the device caused by a higher annealing temperature. In a preferred embodiment, 1% of a polymethyl methacrylate (having a glass transition temperature of 105° C.) is selected to be mixed with a red quantum dot, and thermally annealed at 150° C., and the prepared device has a current efficiency of 29 Cd/A and a T95@1000 nit of 2500 hrs. In another preferred embodiment, 10% of a polydecylidene formamide (having a glass transition temperature of 46° C.) is selected to be mixed with a green quantum dot, and thermally annealed at 60° C. for 30 min, and a prepared device has a current efficiency of 75 Cd/A and a T95@1000 nit of 3500 hrs.

Finally, embodiments of the present application further provide a quantum dot light emitting diode. The quantum dot light emitting diode comprises: an anode, a cathode, and a quantum dot light emitting layer disposed between the anode and the cathode. The quantum dot light emitting layer is the quantum dot film as described in the above embodiments of the present application.

Specifically, the quantum dot light emitting layer is the quantum dot film obtained by the above-described preparation method of the quantum dot film. In the quantum dot light emitting diode provided by the embodiments of the present application, the quantum dot light emitting layer is the quantum dot film obtained by the specific preparation method provided by the above embodiments of the present application, so the quantum dot film can improve the electro-optical efficiency and the lifespan of the quantum dot light emitting diode.

Furthermore, according to some embodiments, in the quantum dot light emitting diode provided by embodiments of the present application, a hole functional layer is provided between the anode and the quantum dot light emitting layer. The hole functional layer is made from a benzyl-containing organic material. The quantum dot light emitting layer contains the quantum dot, the high molecular polymer, and a crosslinking agent. The quantum dot light emitting layer and the hole functional layer are cross-linked at an interface therebetween. The hole functional layer can be obtained by preparing the hole functional layer (the material thereof is a benzyl-containing organic material) on an anode substrate, depositing a mixed solution containing the crosslinking agent, the quantum dot, and the high molecular polymer on the hole functional layer, performing annealing treatment to obtain the quantum dot light emitting layer, and then performing crosslinking reaction with an ultraviolet light. During the process of annealing treatment, the temperature of the annealing treatment is greater than or equal to the glass transition temperature of the high molecular polymer.

The hole functional layer is made from a benzyl-containing organic material, and the material of the quantum dot light emitting layer comprises: the quantum dot, the high molecular polymer, and the crosslinking agents, in this way, during the ultraviolet irradiation process, the crosslinking agent reacts with the benzyl-containing organic material at the interface between the quantum dot light emitting layer and the hole functional layer, during which, the crosslinking agent reacts with the benzyl hydrogen to form stable free radicals, and the crosslinking reaction occurs through free radical coupling, such that the interface contact between the quantum dot light emitting layer and the hole functional layer is stabilized, which reduces the non-radiative recombination caused by interface defects, and improves the electro-optical efficiency and lifespan of the quantum dot light emitting diode.

Specifically, the crosslinking agent is at least one selected from the group consisting of benzophenone, a benzophenone derivative, and any combination thereof. In an embodiment of the present application, a certain proportion of benzophenone and the benzophenone derivative are doped in the quantum dot light emitting layer. The benzophenone and the benzophenone derivative react with the highly active benzyl hydrogen at the surface of the hole functional layer under the ultraviolet light, so as to form stable free radicals. The crosslinking reaction occurs through free radical coupling, so as to form a stable interface contact between the quantum dot light emitting layer and the hole functional layer, which reduces the non-radiative recombination caused by interface defects, and improves the electro-optical efficiency and lifespan of the quantum dot light emitting diode. Furthermore, the benzophenone derivative is at least one selected from 2,4-dinitrobenzophenone, 2-hydroxy-4-methoxybenzophenone, and 2-hydroxy-4-n-octyloxybenzophenone.

The benzyl-containing organic material of the hole functional layer is at least one selected from poly(9-vinylcarbazole), poly[(9,9-dioctylfluorenyl-2,7-diyl)-alt-(4,4'-(N-(4-butylphenyl))diphenylamine)] (TFB), poly[(9,9-dioctylfluorenyl-2,7-diyl)-alt-(2-methoxy-5-(2-ethylhexyloxy)phenylenevinylene-1,4-diyl)]poly(9,9-dioctylfluorenyl-2,7-diyl)-alt-(N,N'-diphenylbenzidine-N,N'-diyl), poly(9,9-dioctylfluorenyl-2,7-diyl), poly[(N,N'-(4-butylphenyl)-N,N-diphenyl-1,4-phenylenediamine)-alt-(9,9-dioctylfluorenyl-2,7-diyl)], poly[9-(1-octylnonyl)-9H-carbazole], poly[2-methoxy-5-(2-ethylhexyloxy)-1,4-phenylacetylene], poly[2-methyl] oxy-5-(2-ethylhexyloxy)-

1,4-phenylacetylene], poly[(9,9-dioctylfluorenyl-2,7-diyl)-co-(bithiophene)], poly[(9,9-dioctylfluorenyl-2,7-diyl)-alt-(benzo[2,1,3]thiadiazole-4,8-diyl)], and any combination thereof. The above hole functional material not only contains the benzyl group and can be cross-linked with benzophenone or the benzophenone derivative, but also has good hole transport performance.

Furthermore, in some embodiments, the mixed solution containing the high molecular polymer, the crosslinking agent, and the quantum dot is prepared by dissolving the above-mentioned high molecular polymer, the crosslinking agent, and the quantum dot material in a solvent. A weight ratio of the crosslinking agent to the quantum dot material is (0.5-5):100. Specifically, the weight ratio of the crosslinking agent to the quantum dot material can be 0.5:100, 1:100, 2:100, 4:100, 5:100, and the like. When the proportion of the crosslinking agent is too low, the content of the crosslinking agent at the interface between the quantum dot light emitting layer and the hole functional layer is too few, and cannot be fully cross-linked with the material of the hole functional layer, resulting in poor contact effect at the interface. When the proportion of the crosslinking agent is too high, since benzophenone or the benzophenone derivative is non-conductive crosslinking agent, although being beneficial to the crosslinking, the excess crosslinking agent will increase the difficulty of injection and transport of electrons and holes in the quantum dot light emitting layer, and will reduce the probability of the radiative recombination of carriers in the quantum dot light emitting layer. Therefore, the quantum dot light emitting layer formed by the crosslinking agent and the quantum dot material within the above weight ratio range can not only obtain good interface morphology, but also improve the electro-optical efficiency and lifespan of the QLED devices. Furthermore, the solvent in the mixed solution is selected from a non-polar solvent, such as a hydrocarbon solvent. Specifically, the hydrocarbon solvent is at least one selected from the group consisting of a saturated or unsaturated alkane, a saturated or unsaturated aromatic hydrocarbon, and any combination thereof. The mixed solution dispersed with the crosslinking agent and the quantum dot is deposited on the surface of the hole functional layer, annealed to remove the solvent, and then cross-linked with the benzyl-containing organic material on the surface of the hole functional layer under ultraviolet light to form a stable interface contact.

A method for preparing a quantum dot light emitting diode, comprises the following steps:

E01: providing a substrate; and

E02: preparing a quantum dot film on the substrate by using the preparation method provided by embodiments of the present application, to obtain the quantum dot light emitting layer.

In the preparation process of the QLED device, under the existing film formation process conditions, such as spin coating, blade coating, printing, spray coating, and the like, the quantum dot materials of the quantum dot light emitting layer have the problems of loose accumulation and irregular arrangement, which results in holes in the formed quantum dot film, and in turn makes the material of the hole functional layer and the material of the electron functional layer have the opportunity to directly contact with each other; in such condition, when the device is energized, electrons and holes accumulate at the interface layer to form excitons and generate exciton recombination regions, causing the carrier transport material to emit light, causing obvious stray light peaks on the electroluminescence spectrum and affecting the luminescence purity, moreover, the accumulated charge at the interface will generate Joule heat, especially at high current density, and the heat will affect the formation of excitons, thereby affecting the luminous efficiency and lifespan of the device. By contrast, in the preparation method of the quantum dot light emitting diode provided by embodiments of the present application, the quantum dot light emitting layer film is obtained by the specific preparation method, which enables the position of the quantum dot to be rearranged, and in turn tightly accumulated and regularly arranged in the high molecular polymer, whereby forming a flat the quantum dot light emitting layer, and significantly improving the electro-optical efficiency and lifespan of the device.

In some embodiments, the substrate is an anode substrate, and after obtaining the quantum dot light emitting layer, the method further includes: preparing a cathode on the quantum dot light emitting layer; or alternatively, the substrate is a cathode substrate, and after obtaining the quantum dot light emitting layer, the method further includes: preparing an anode on the quantum dot light emitting layer. The quantum dot light emitting diode prepared in this way includes: the anode, the cathode, and the quantum dot light emitting layer located between the anode and the anode. The quantum dot light emitting layer is the quantum dot film as described in the present application or the quantum dot film obtained by the above-mentioned method for preparing of the quantum dot film.

Furthermore, in some embodiments, a hole functional layer (made from the benzyl-containing organic material) is prepared on the anode substrate, a mixed solution containing a crosslinking agent, a quantum dot, and a high molecular polymer is deposited on the hole functional layer, annealing treatment is performed to obtain the quantum dot light emitting layer, and then crosslinking reaction is performed under the ultraviolet light. In the process of annealing treatment, the temperature of the annealing treatment is greater than or equal to the glass transition temperature of the high molecular polymer. Furthermore, in some embodiments, the mixed solution containing the high molecular polymer, the crosslinking agent, and the quantum dot is prepared by dissolving the above-mentioned high molecular polymer, the crosslinking agent, and the quantum dot material in a solvent. A weight ratio of the crosslinking agent to the quantum dot material is (0.5-5):100.

In an embodiment, when preparing the quantum dot light emitting layer containing the quantum dot, the high molecular polymer, and the crosslinking agent, the temperature of the annealing treatment is between 50 and 250° C., and the time of the annealing treatment is between 10 and 30 min; and under the above annealing conditions, the film formation effect is better. In an embodiment, the wavelength of the ultraviolet light is between 200 and 410 nm, and the time of the ultraviolet light is between 5 and 15 min, and under the above-mentioned ultraviolet light conditions, the effect of the crosslinking reaction is better. Under the ultraviolet light of between 200 and 410 nm, the carbonyl group in benzophenone and the benzophenone derivative reacts with the highly active benzyl hydrogen in the hole functional layer material, which can form stable free radicals after the reaction, and the generated free radicals can be crossed linked through free radical coupling, whereby obtaining a film having closely adjacent quantum dot light emitting layer and hole functional layer at the interface therebetween.

Furthermore, in another embodiment, in the quantum dot light emitting diode provided by the embodiment of the present application, a hole functional layer is provided between the anode and the quantum dot light emitting layer.

A material of the hole functional layer includes a crosslinking product after crosslinking between the crosslinking agent and the benzyl-containing organic material. The quantum dot light emitting layer contains the quantum dot and the high molecular polymer. The hole functional layer can be obtained by depositing a mixed solution containing a crosslinking agent and a benzyl-containing organic material on a substrate, performing annealing treatment, and then performing a crosslinking reaction under an ultraviolet light. During the ultraviolet irradiation process, the crosslinking agent reacts with benzyl hydrogen in the benzyl-containing organic material to form stable free radicals, and the crosslinking reaction is carried out through free radical coupling, thereby forming a hole functional layer film that is insoluble in hydrocarbon organic solvent. The hole functional layer film obtained by such a preparation method has good stability and is not easily affected by the solvent used in the preparation of the quantum dot light emitting layer, so that a resulting device has a smooth and complete thin film shape to improve the luminous performance and lifespan of the device.

The mixed solution containing the crosslinking agent and the benzyl-containing organic material is prepared by dissolving the above-mentioned crosslinking agent and the benzyl-containing organic material in a solvent. The concentration of the benzyl-containing organic material in the mixed solution is between 8 and 50 mg/mL, and the benzyl-containing organic material has a better dispersion effect under such concentration. A weight ratio of the crosslinking agent to the benzyl-containing organic material in the mixed solution is (0.5-10):100. When the proportion of the crosslinking agent is too low, the benzyl-containing organic material is insufficiently cross-linked, and the crosslinking may also be destructed during the subsequent preparation of the quantum dot light emitting layer. When the proportion of the crosslinking agent is too high, since benzophenone or the benzophenone derivative is non-conductive crosslinking agent, although being beneficial for crosslinking, the excess crosslinking agent will reduce the injection and transportation of the holes in the hole functional layer, which in turn affects the overall performance of the device. Therefore, the crosslinking agent and the benzyl-containing organic material in the above ratio range not only ensure good film morphology, but also help to improve the current efficiency and lifespan performance of the device.

In some embodiments, the annealing temperature of the annealing treatment performed on the mixed solution containing the crosslinking agent and the benzyl-containing organic material that is deposited on the substrate may be between 80 and 150° C., for example, the temperature of the annealing treatment may be 80° C., 100° C., 120° C., 150° C., and the like. The time of the annealing treatment is between 10 and 30 min, such as 5 min, 10 min, and 15 min. The film formation effect of the hole functional layer is better under the above annealing conditions. In an embodiment, the wavelength of the ultraviolet light is between 200 and 410 nm, such as 200 nm, 250 nm, 300 nm, 400 nm, and the like; and the time of the ultraviolet light treatment is between 5 and 15 min, such as 5 min, 10 min, and 15 min. Under the above-mentioned ultraviolet light conditions, the effect of crosslinking reaction is better.

In some embodiments, in the above quantum dot light emitting diode device, between the quantum dot light emitting layer and the anode is disposed a hole functional layer, such as a hole transport layer, or a hole injection layer and a hole transport layer stacked together, in which, the hole injection layer is arranged adjacent to the anode. In another embodiment, in the above quantum dot light emitting diode device, an electron functional layer, such as an electron transport layer, or an electron injection layer and an electron transport layer stacked together, is disposed between the quantum dot light emitting layer and the cathode, in which, the electron injection layer is arranged adjacent to the cathode.

The quantum dot light emitting diode provided by the embodiment of the present application includes a forward structure and an inverted structure.

In an embodiment, the forward structure of the quantum dot light emitting diode comprises: an anode, a cathode stacked oppositely relative to the anode, a quantum dot light emitting layer arranged between the anode and the cathode, a hole transport layer arranged between the anode and the quantum dot light emitting layer. The anode is arranged on a base. Furthermore, between the anode and the quantum dot light emitting layer, can also be arranged a hole functional layer, such as a hole injection layer and an electron blocking layer; and between the cathode and the quantum dot light emitting layer, can also be arranged an electron functional layers, such as an electron transport layer, an electron injection layer, and a hole blocking layer. In some embodiments of the forward structure device, the quantum dot light emitting diode comprises: a base, an anode disposed on a surface of the base, a hole injection layer disposed on a surface of the anode, a hole transport layer disposed on a surface of the hole injection layer, a quantum dot light emitting layer disposed on a surface of the hole transport layer, an electron transport layer disposed on a surface of the quantum dot light emitting layer, and a cathode disposed on a surface of the electron transport layer.

In an embodiment, the inverted structure quantum dot light emitting diode comprises: an anode, a cathode stacked oppositely relative to the anode, a quantum dot light emitting layer arranged between the anode and the cathode, a hole transport layer arranged between the anode and the quantum dot light emitting layer. The cathode is arranged on a base. Furthermore, between the anode and the quantum dot light emitting layer, can also be arranged a hole functional layer, such as a hole injection layer and an electron blocking layer; and between the cathode and the quantum dot light emitting layer, can also be arranged an electron functional layers, such as an electron transport layer, an electron injection layer, and a hole blocking layer. In some embodiments of the inverted structure device, the quantum dot light emitting diode comprises: a base, a cathode disposed on a surface of the base, an electron transport layer disposed on a surface of the cathode, a quantum dot light emitting layer disposed on a surface of the electron transport layer, a hole transport layer disposed on a surface of the quantum dot light emitting layer, a hole injection layer disposed on a surface of the hole transport layer, and an anode disposed on a surface of the hole injection layer.

The base comprises a rigid and flexible base, and specifically comprises: a glass, a silicon wafer, a polycarbonate, a polymethyl methacrylate, a polyethylene terephthalate, a polyethylene naphthalate, a polyamide, a polyethersulfone, or a combination thereof.

The anode comprises: a metal, such as nickel, platinum, vanadium, chromium, copper, zinc, or gold, or an alloy thereof; a conductive metal oxide, such as zinc oxide, indium oxide, tin oxide, indium tin oxide (ITO), indium zinc oxide (IZO), or fluorine-doped tin oxide; a combination of a metal and an oxide, such as ZnO and Al, or SnO₂ and Sb, which is not limited thereto, and can be a combination of any two or more of the above.

The hole injection layer comprises a conductive compound, which comprises: a polythiophene, a polyaniline, a polypyrrole, a poly(p-phenylene), a polyfluorene, a poly(3, 4-ethylenedioxythiophene), poly(3,4-ethylenedioxythiophene) polystyrene sulfonate (PEDOT:PSS), $MoO_3$, $WoO_3$, NiO, HATCN, CuO, $V_2O_5$, CuS, or a combination thereof.

The hole transport layer may comprise one or more of PVK, Poly-TPD, CBP, TCTA, and TFB.

The quantum dot of the quantum dot light emitting layer is a group II-VI compound, such as CdS, CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe; or a group III-V compound, such as GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb; or a group IV-VI compound, such as SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe; or a combination of any one or more of the above.

The electron transport layer is one or more of ZnO, $TiO_2$, $Alq_3$, $SnO_2$, ZrO, AlZnO, ZnSnO, BCP, TAZ, PBD, TPBI, Bphen, and $CsCO_3$.

The cathode comprises a metal, such as magnesium, calcium, sodium, potassium, titanium, indium, yttrium, lithium, gadolinium, aluminum, silver, tin, lead, cesium, or barium, or an alloy thereof. The multilayer construction material comprises: a first layer, which is selected from an alkali metal halide, an alkaline earth metal halide, an alkali metal oxide, or a combinations thereof; and a metal layer, which comprises an alkaline earth metal, a group 13 metal, or a combination thereof. For example, the multilayer construction material may be LiF/Al, $LiO_2$/Al, LiF/Ca, Liq/Al, and BaF2/Ca, but not limited thereto.

In a specific embodiment, the anode is selected from indium tin oxide (ITO), the hole injection layer is PEDOT: PSS, the hole transport layer is TFB, the electron transport layer is ZnO, and the cathode is Ag.

In a specific embodiment, the anode has a thickness of between 20 and 200 nm. The hole injection layer has a thickness of between 20 and 200 nm. The hole transport layer has a thickness of between 30 and 180 nm. The quantum dot mixed light emitting layer has a total thickness of between 30 and 180 nm. The electron transport layer has a thickness of between 10 and 180 nm; and the cathode has a thickness of between 40 and 190 nm.

The application has been subjected to various tests successively, and hereinbelow a part of the test results are taken as a reference to further describe the application in detail.

Example 1

Figure 2:
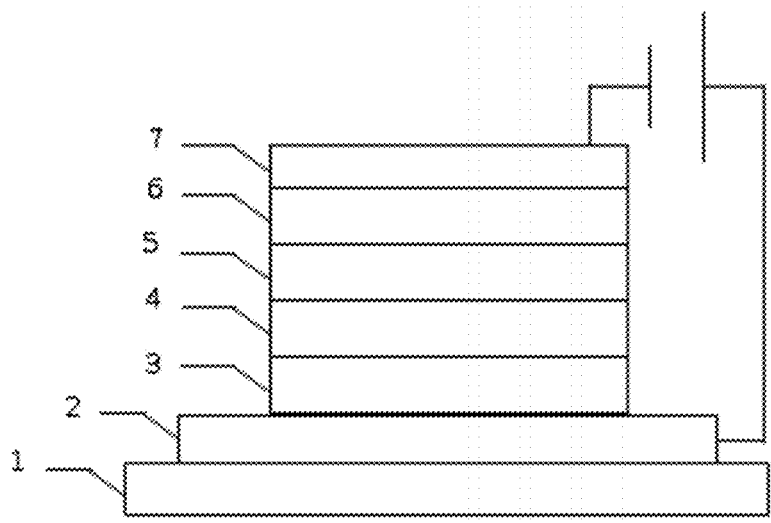
FIG. 2 is a structural schematic diagram of a quantum dot light emitting diode according to an embodiment of the present application.

This example provides a QLED device, the structure of which is shown in FIG. 2. The QLED device comprises: a base 1, an anode 2, a hole injection layer 3, a hole transport layer 4, a quantum dot light emitting layer 5, an electron transport layer 6, and a cathode 7, which are sequentially arranged from bottom to top. A material of the base 1 is a glass sheet; a material of the anode 2 is an ITO substrate; a material of the hole injection layer 3 is PEDOT:PSS; a material of the hole transport layer 4 is TFB; the quantum dot light emitting layer 5 includes a CdZnSe/ZnSe/ZnS red quantum dot and a polymethyl methacrylate; a material of the electron transport layer 6 is ZnO; and a material of the cathode 7 is Al.

The device was prepared by the following steps:

The PEDOT:PSS material was spin coated on the anode made from ITO, then anneal at 100° C. for 15 min to form the hole injection layer. The hole transport layer made from TFB was formed on the hole injection layer, anneal at 100° C. for 15 min. The hole transport layer was used as a carrier. A mixed solution composed of a polymethyl methacrylate (having a glass transition temperature of 105° C.) and a CdZnSe/ZnSe/ZnS red quantum dot with a weight ratio of 1:100 was then spin coated onto the hole transport layer, baked on a hot plate at 150° C. for 30 min, during which, the position of the quantum dot was rearranged, and the quantum dot light emitting layer was obtained. After that, an ethanol solution of ZnO was deposited on the quantum dot light emitting layer to obtain an electron transport layer. Finally, Al was evaporated on the electron transport layer to form the cathode layer, and a resulting product was encapsulated to form an electroluminescent device.

Example 2

This example provides a QLED device, the structure of which is shown in FIG. 2. The QLED device comprises: a base 1, an anode 2, a hole injection layer 3, a hole transport layer 4, a quantum dot light emitting layer 5, an electron transport layer 6, and a cathode 7, which are sequentially arranged from bottom to top. A material of the base 1 is a glass sheet; a material of the anode 2 is an ITO substrate; a material of the hole injection layer 3 is PEDOT:PSS; a material of the hole transport layer 4 is TFB; the quantum dot light emitting layer 5 includes a CdZnSe/CdZnS/ZnS red quantum dot and a polyethylene terephthalate; a material of the electron transport layer 6 is ZnO; and a material of the cathode 7 is Al.

The device was prepared by the following steps:

The PEDOT:PSS material was spin coated on the anode made from ITO, then anneal at 100° C. for 15 min to form the hole injection layer. The hole transport layer made from TFB was formed on the hole injection layer, anneal at 100° C. for 15 min. The hole transport layer was used as a carrier. A mixed solution composed of the polyethylene terephthalate and the quantum dot with a weight ratio of 0.5:100 was then spin coated onto the hole transport layer, baked on a hot plate at 80° C. for 30 min, during which, the position of the quantum dot was rearranged, and the quantum dot light emitting layer was obtained. After that, an ethanol solution of ZnO was deposited on the quantum dot light emitting layer to obtain an electron transport layer. Finally, Al was evaporated on the electron transport layer to form the cathode layer, and a resulting product was encapsulated to form an electroluminescent device.

Example 3

This example provides a QLED device, the structure of which is shown in FIG. 2. The QLED device comprises: a base 1, an anode 2, a hole injection layer 3, a hole transport layer 4, a quantum dot light emitting layer 5, an electron transport layer 6, and a cathode 7, which are sequentially arranged from bottom to top. A material of the base 1 is a glass sheet; a material of the anode 2 is an ITO substrate; a material of the hole injection layer 3 is PEDOT:PSS; a material of the hole transport layer 4 is TFB; the quantum dot light emitting layer 5 includes a CdZnSe/ZnSe/ZnS green quantum dot and a polydecylidene formamide; a material of the electron transport layer 6 is ZnO; and a material of the cathode 7 is Al.

The device was prepared by the following steps:

The PEDOT:PSS material was spin coated on the anode made from ITO, then anneal at 100° C. for 15 min to form the hole injection layer. The hole transport layer made from TFB was formed on the hole injection layer, anneal at 100° C. for 15 min. The hole transport layer was used as a carrier. A mixed solution composed of the polydecylidene formamide and the quantum dot with a weight ratio of 10:100 was then spin coated onto the hole transport layer, baked on a hot plate at 60° C. for 30 min, during which, the position of the quantum dot was rearranged, and the quantum dot light emitting layer was obtained. After that, an ethanol solution of ZnO was deposited on the quantum dot light emitting layer to obtain an electron transport layer. Finally, Al was evaporated on the electron transport layer to form the cathode layer, and a resulting product was encapsulated to form an electroluminescent device.

Comparative Example 1

The quantum dot light emitting diode of this comparative Example is the same as that of Example 1, except that the light emitting layer of the quantum dot light emitting diode in this comparative Example only contains the quantum dot.

Comparative Example 2

The quantum dot light emitting diode of this comparative Example is the same as that of Example 2, except that the light emitting layer of the quantum dot light emitting diode in this comparative Example only contains the quantum dot.

Comparative Example 3

The quantum dot light emitting diode of this comparative Example is the same as that of Example 3, except that the light emitting layer of the quantum dot light emitting diode in this comparative Example only contains the quantum dot.

Performance Testing

Figure 3:
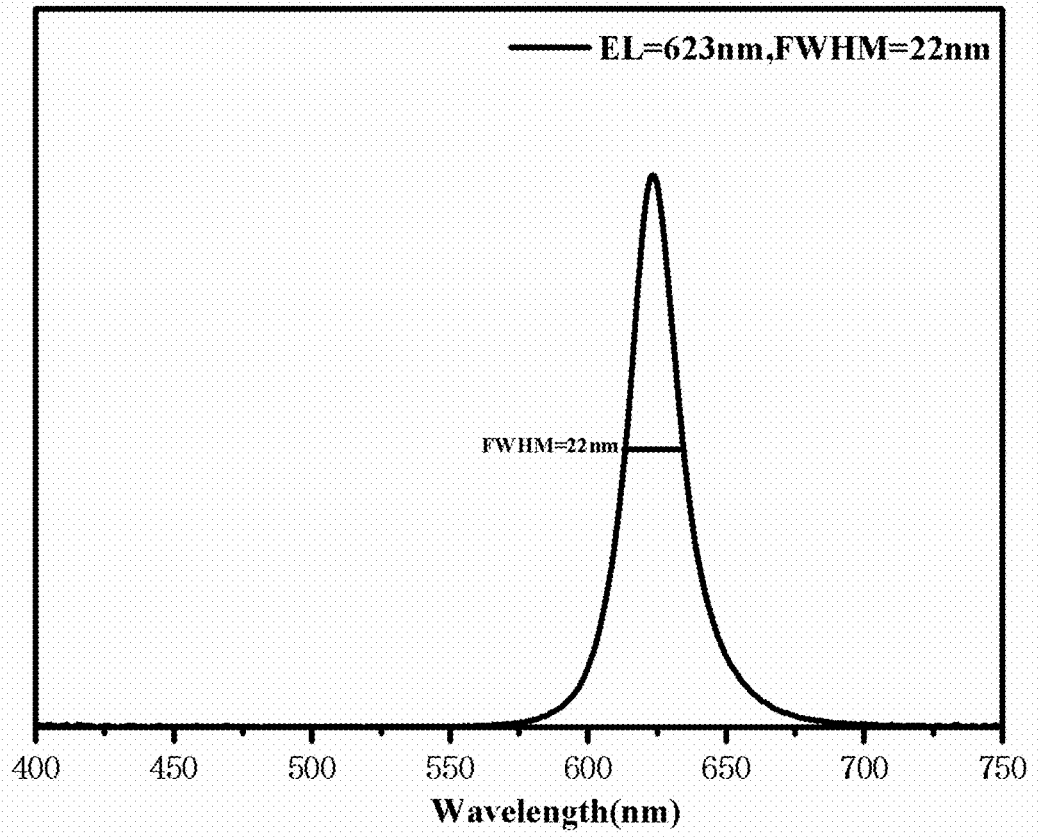
FIG. 3 is electroluminescence spectra of devices provided by Example 1 of the present application and Comparative Example 1.
Figure 4:
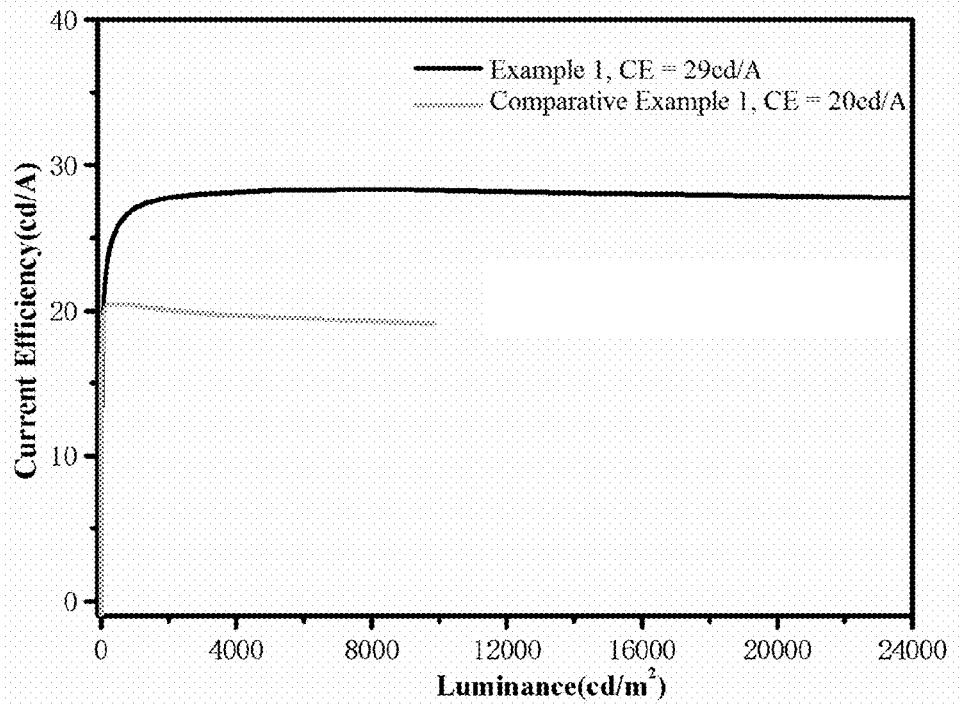
FIG. 4 is a current efficiency graph of devices provided by Example 1 of the present application and Comparative Example 1.
Figure 5:
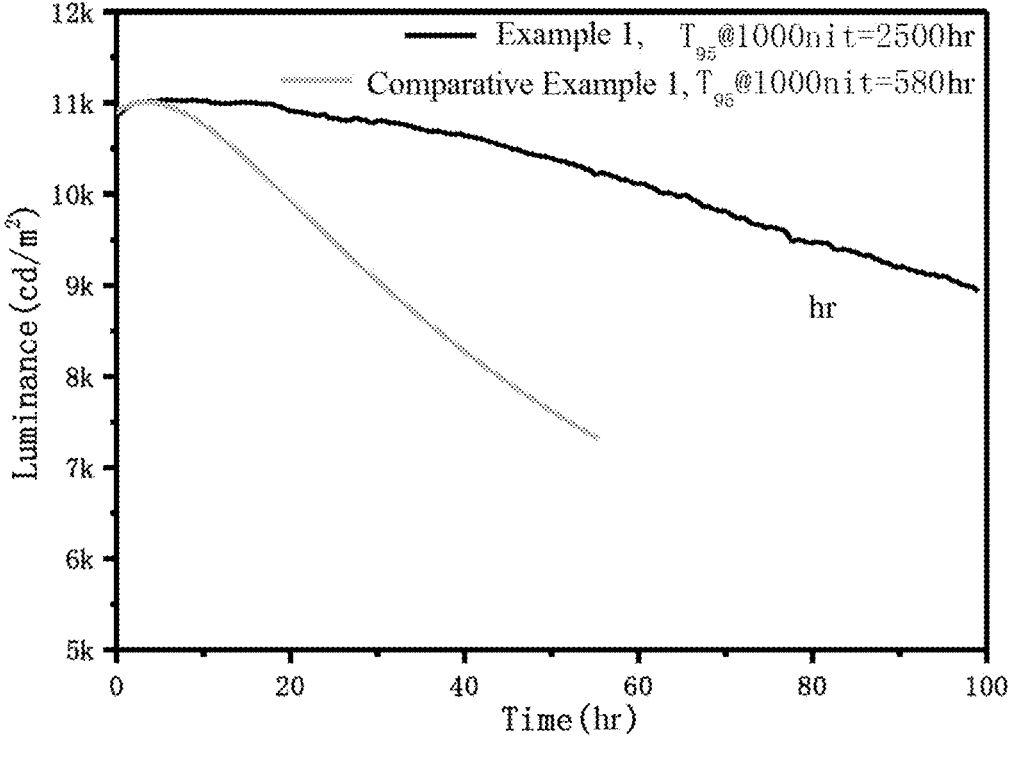
FIG. 5 is lifespan test curves of devices provided by Example 1 of the present application and Comparative Example 1.

The photoelectric properties and lifespan of the quantum dot light emitting diode devices of the above examples and comparative examples were tested, and the test results are shown in Table 1, in which, the results of Example 1 and the comparative examples are shown in FIGS. 3-5.

The lifespan test of the device was performed by using a 128-channel lifespan test system customized by Guangzhou New Vision Company. The system architecture was as follows: the QLED to be tested was driven with a constant voltage and constant current source, in order to test the change of voltage or current; a photodiode detector and a test system were used to test the change of the brightness (photocurrent) of the QLED; and a luminance meter was used to test and calibrate the brightness (photocurrent) of the QLED.

15

TABLE 1

| | EL (nm) | FWHM (nm) | EQE (%) | CE (cd/A) | T95@1000nit (h) |
|---|---|---|---|---|---|
| Example 1 | 623 | 22 | 20 | 29 | 2500 |
| Comparative Example 1 | 623 | 22 | 14 | 20 | 580 |
| Example 2 | 633 | 21 | 19.5 | 24 | 2200 |
| Comparative Example 2 | 633 | 21 | 12 | 15 | 340 |
| Example 3 | 534 | 25 | 18 | 75 | 3500 |
| Comparative Example 3 | 534 | 25 | 10 | 41.5 | 760 |

It can be seen from the data comparison in Table 1 that in the quantum dot light emitting diode provided by embodiments of the present application, the quantum dot film formed by depositing the mixed solution containing a quantum dot and a high molecular polymer on the substrate, is annealed to make the position of the quantum dot in the quantum dot film rearranged, such that the quantum dot is tightly accumulated and regularly arranged in the high molecular polymer, whereby forming a flat quantum dot film. The quantum dot light emitting diode device, when compared with the quantum dot light emitting device not adopting the high molecular polymer, has both improved electro-optical efficiency and lifespan. From the analysis of the current efficiency-brightness curve of Example 1 and Comparative Example 1, the device after the position rearrangement of the quantum dot has a current efficiency value of about 1.5 times that of a normal device, and less obvious roll-off effect. An obtained lifespan test data is 4.3 times that of the normal device. The other two groups of examples and comparative examples have the same results. It is indicated that the solution provided in this application has a certain improvement effect on the accumulation and arrangement of quantum dots in the light-emitting layer of the device, and the optoelectronic performance and lifespan of the quantum dot light-emitting device are improved.

The above are only optional embodiments of the present application, and are not intended to limit the present application. Various modifications and variations of the present application are possible for those skilled in the art. Any modification, equivalent replacement, and improvement made within the spirit and principle of the present application shall be included within the scope of the claims of the present application.

What is claimed is:

1. A quantum dot film, comprising a quantum dot and a high molecular polymer; wherein
   an annealing temperature of the quantum dot film during annealing for film formation is greater than or equal to a glass transition temperature of the high molecular polymer; and
   a weight ratio of the high molecular polymer to the quantum dot is (0.5-10): 100.

2. The quantum dot film according to claim 1, wherein the high molecular polymer is at least one selected from the group consisting of a vinyl-based polymer, an acryl-based polymer, an amide-based polymer, a phenyl-based polymer, a carbonate-based polymer, and any combination thereof.

3. The quantum dot film according to claim 2, wherein
   the vinyl-based polymer is at least one selected from the group consisting of a polyvinyl alcohol, a polyvinyl carbazole, a polyvinyl acetate, a polytetrafluoroethylene, a polyvinylidene fluoride, a polyvinyl chloride, and any combination thereof; or

the acryl-based polymer is at least one selected from the group consisting of a polyacrylic acid, a polymethyl methacrylate, a poly(α-butyl cyanoacrylate), a polyacrylamide, and a polyacrylonitrile; or
   the amide-based polymer is at least one selected from the group consisting of a polydecylidene formamide, a polyethylene glycol sebacamide, and any combination thereof; or
   the phenyl-based polymer is at least one selected from the group consisting of a polyphenylene sulfide, a polyethylene terephthalate, and any combination thereof; or
   the carbonate-based polymer is at least one selected from the group consisting of a polycarbonate diol, a brominated polycarbonate, and any combination thereof.

4. A quantum dot light emitting diode, comprising:
   an anode,
   a cathode, and
   the quantum dot film according to claim 1, disposed between the anode and the cathode.

5. The quantum dot light emitting diode according to claim 4, wherein the high molecular polymer is at least one selected from the group consisting of a vinyl-based polymer, an acryl-based polymer, an amide-based polymer, a phenyl-based polymer, a carbonate-based polymer, and any combination thereof.

6. The quantum dot light emitting diode according to claim 5, wherein
   the vinyl-based polymer is at least one selected from the group consisting of a polyvinyl alcohol, a polyvinyl carbazole, a polyvinyl acetate, a polytetrafluoroethylene, a polyvinylidene fluoride, a polyvinyl chloride, and any combination thereof; or
   the acryl-based polymer is at least one selected from the group consisting of a polyacrylic acid, a polymethyl methacrylate, a poly(α-butyl cyanoacrylate), a polyacrylamide, and a polyacrylonitrile; or
   the amide-based polymer is at least one selected from the group consisting of a polydecylidene formamide, a polyethylene glycol sebacamide, and any combination thereof; or
   the phenyl-based polymer is at least one selected from the group consisting of a polyphenylene sulfide, a polyethylene terephthalate, and any combination thereof; or
   the carbonate-based polymer is at least one selected from the group consisting of a polycarbonate diol, a brominated polycarbonate, and any combination thereof.

7. The quantum dot light emitting diode according to claim 4, wherein a hole functional layer is disposed between the quantum dot film and the anode.

8. The quantum dot light emitting diode according to claim 4, wherein an electron functional layer is disposed between the quantum dot film and the cathode.

9. A method for preparing the quantum dot film according to claim 1, comprising the following steps:
   providing a substrate; and
   depositing a mixed solution containing a quantum dot and a high molecular polymer onto the substrate, and performing annealing treatment to obtain the quantum dot film;
   wherein, a temperature of the annealing treatment is greater than or equal to a glass transition temperature of the high molecular polymer.

10. The method for preparing the quantum dot film according to claim 9, wherein the glass transition temperature of the high molecular polymer is between 30 and 200° C.

11. The method for preparing the quantum dot film according to claim 9, wherein the temperature of the annealing treatment is between 8° and 250° C.

12. The method for preparing the quantum dot film according to claim 9, wherein the glass transition temperature of the high molecular polymer is between 5° and 150° C., and the temperature of the annealing treatment is between 12° and 180° C.

13. The method for preparing the quantum dot film according to claim 9, wherein a difference value between the temperature of the annealing treatment and the glass transition temperature of the high molecular polymer is 220° C. at most.

14. The method for preparing the quantum dot film according to claim 9, wherein a concentration of the quantum dot in the mixed solution is between 10 and 50 mg/mL.

15. The method for preparing the quantum dot film according to claim 9, wherein a weight ratio of the high molecular polymer to the quantum dot in the mixed solution is (0.5-10): 100.

16. The method for preparing the quantum dot film according to claim 9, wherein the solvent in the mixed solution is selected from a non-polar solvent.

17. The method for preparing the quantum dot film according to claim 9, wherein the high molecular polymer is at least one selected from the group consisting of a vinyl-based polymer, an acryl-based polymer, an amide-based polymer, a phenyl-based polymer, a carbonate-based polymer, and any combination thereof.

18. The method for preparing the quantum dot film according to claim 17, wherein the vinyl-based polymer is at least one selected from the group consisting of a polyvinyl alcohol, a polyvinyl carbazole, a polyvinyl acetate, a polytetrafluoroethylene, a polyvinylidene fluoride, a polyvinyl chloride, and any combination thereof; or the acryl-based polymer is at least one selected from the group consisting of a polyacrylic acid, a polymethyl methacrylate, a poly($\alpha$-butyl cyanoacrylate), a polyacrylamide, and a polyacrylonitrile; or the amide-based polymer is at least one selected from the group consisting of a polydecylidene formamide, a polyethylene glycol sebacamide, and any combination thereof; or the phenyl-based polymer is at least one selected from the group consisting of a polyphenylene sulfide, a polyethylene terephthalate, and any combination thereof; or the carbonate-based polymer is at least one selected from the group consisting of a polycarbonate diol, a brominated polycarbonate, and any combination thereof.

\* \* \* \* \*